United States Patent [19]

Piesinger

[11] Patent Number: 5,352,984
[45] Date of Patent: Oct. 4, 1994

[54] FAULT AND SPLICE FINDING SYSTEM AND METHOD

[75] Inventor: Gregory H. Piesinger, Cave Creek, Ariz.

[73] Assignee: Cable Repair Systems Corporation, Coral Springs, Fla.

[21] Appl. No.: 972,240

[22] Filed: Nov. 4, 1992

[51] Int. Cl.⁵ .......................................... G01R 31/08
[52] U.S. Cl. .................................. 324/532; 324/528; 324/535
[58] Field of Search ............... 324/527, 528, 532, 533, 324/534, 535

[56] References Cited

U.S. PATENT DOCUMENTS

| | | | |
|---|---|---|---|
| 3,991,364 | 11/1976 | Wiznerowicz | 324/533 |
| 4,241,305 | 12/1980 | Dickerson | 324/532 |
| 4,835,478 | 5/1989 | Haddon et al. | 324/536 |
| 5,083,086 | 1/1992 | Steiner | 324/533 |
| 5,138,265 | 8/1992 | Kawamura et al. | 324/535 |
| 5,243,294 | 9/1993 | Burnett | 324/535 |

*Primary Examiner*—Kenneth A. Wieder
*Assistant Examiner*—Glenn W. Brown
*Attorney, Agent, or Firm*—Robert A. Parsons; Don J. Flickinger; Jordan M. Meschkow

[57] ABSTRACT

A PN modulated signal is applied to a near end of a buried electrical cable. The signal produces an initial pulse, a second pulse of energy reflected from a fault and a third pulse representative of the far end of the cable. The time/distance between the second and third pulses is stored. As the PN signal is continuously applied an operator, using an antenna coupled monitor, walks along the cable noting the time/distance between the initial and third pulses. When this time/distance equals the stored time/distance the operator is standing over the fault. If the fault is a high resistance fault a high voltage pulse is applied to the near end of the cable. The PN signal is initially sensed at a time when the fault has a low resistance because of arcing due to the high voltage pulse. To reduce stress on the cable, the arc is initialized by a high voltage low current signal and is maintained by a low voltage high current signal.

11 Claims, 6 Drawing Sheets

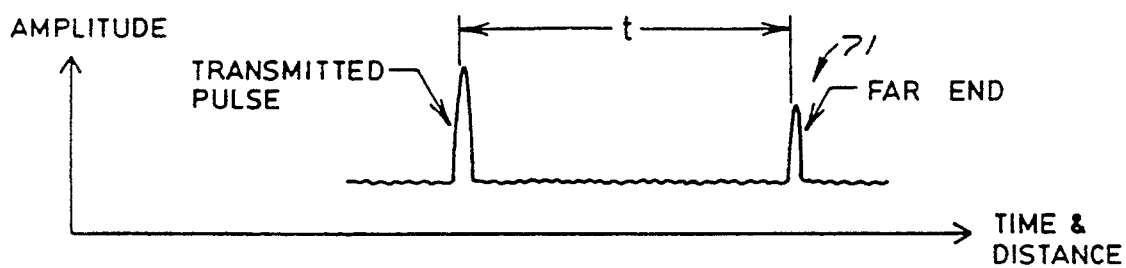
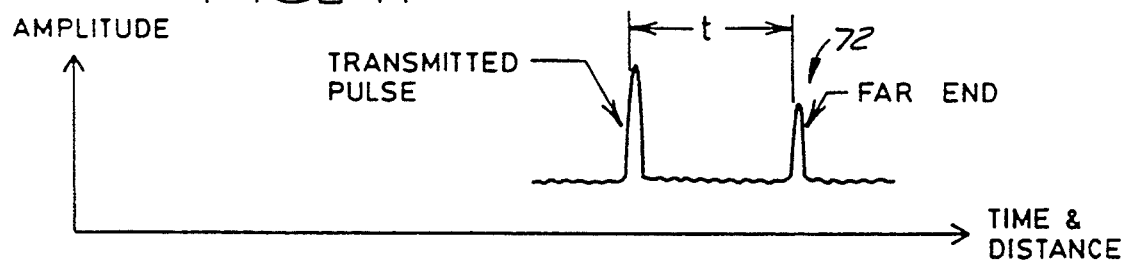
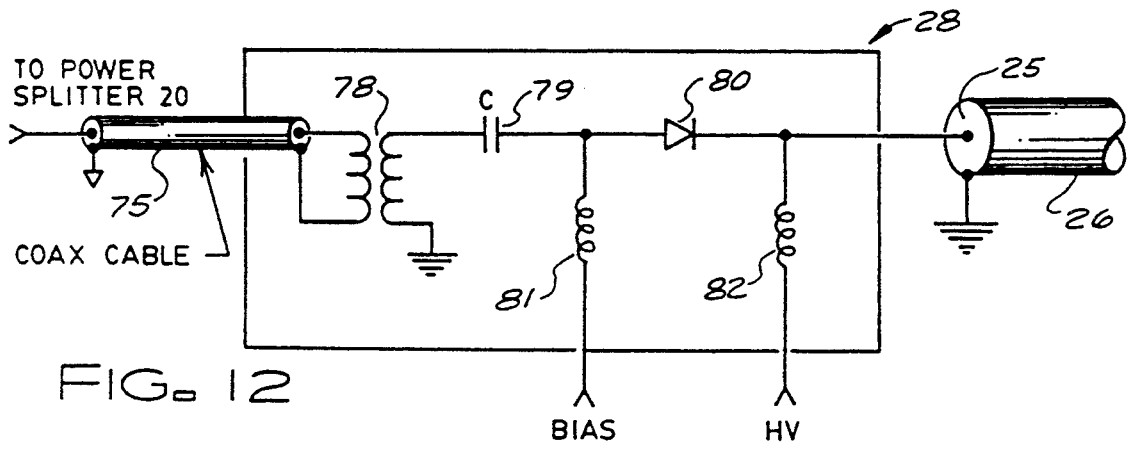
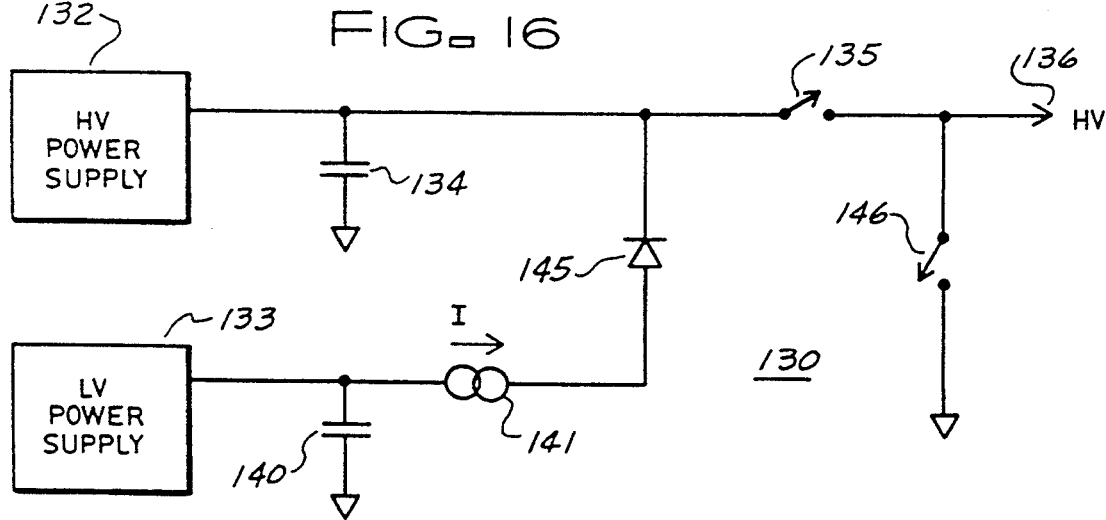

FAULT AND SPLICE FINDING SYSTEM AND METHOD

BACKGROUND OF THE INVENTION

1. Field of the Invention

The present invention pertains to a system for finding discontinuities in generally inaccessible cables and more specifically to a system for very accurately finding faults or splices in underground power cables and the like.

2. Prior Art

It has always been very difficult to find faults and splices in inaccessible cables such as underground power cables. Further, it is extremely important to be able to accurately determine the position of the fault or splice because much time and labor is expended in digging and uncovering portions of the cable to actually gain access to the fault or splice for repair purposes.

Current art attempts to locate faults and splices in a cable by using a time domain reflectometer (TDR) also called a cable-radar. A TDR is an instrument that transmits a short electrical pulse into one end of a cable and then receives a return pulse that is reflected from the cable fault or splice point.

A TDR operates on the principle that any discontinuity in the electrical impedance of the cable will reflect part of the transmitted pulse energy. Low resistance faults, opens, shorts, and cable splices form such an impedance discontinuity and can therefore be detected using a TDR.

The TDR only measures the electrical distance to the fault. The electrical distance is converted to physical distance from knowledge of the approximate propagation velocity of the TDR pulses. This physical distance is then found by tracking the cable path using a tone generator and precisely measuring distance from the TDR using a tape measure. This is a very time consuming process because the exact path of the cable must be accurately traced and measured to obtain a reasonable indication of the fault location.

For locating high resistance faults, the TDR is combined with a device known as a "thumper". A thumper is a piece of equipment that applies high voltage dc pulses into a sectionalized cable run. The thumper is used to induce arcing at the high resistance fault, thus producing a low resistance fault for a short time during the discharge arc period. The location of this low resistance discharge arc can then be determined either by using a TDR or by timing the discharge pulse transients that travel back and forth between the fault and the thumper.

The TDR measures actual electrical distance to the fault which is usually quite different than the physical measurement of the cable path above ground. Some of the reasons for this difference is the meandering of the cable, both in vertical and horizontal directions, inability to accurately follow the cable because of obstructions and the like, compounded measurement errors in the tone generator tracking procedure, etc. This difference is the main reason that a TDR is limited to prelocation rather than the pinpointing of a fault.

To pinpoint the fault, one or two crew members go to the TDR indicated approximate fault area. A third crew member energizes the thumper while the crew members at the fault area listen for the audible sound of the high voltage discharge arc. If the crew members at the fault area cannot hear the discharge "thump" they often increase the voltage on the thumper until the thump becomes audible. The combination of excessive thump pulse time and excessive dc voltage on the cable damages the polyethylene cable insulation and can cause the cable to fault prematurely in the future.

A further problem with TDR is that extremely long cables and large numbers of discontinuities drain the energy of the initial pulse. TDR signals are attenuated as they propagate down the cable under test. As a result, equal amplitude discontinuities appear smaller at longer distances down the cable than they do at shorter distances. An operator can be misled into interpreting a small reflection at a long distance down the cable as originating from a minor discontinuity and possibly dismissing it as being insignificant. In reality, however, the discontinuity may be quite significant and important.

In addition to cable attenuation, short range discontinuities reflect significant energy, thus leaving less energy available to illuminate discontinuities further down the cable. This reduced incident energy on distant discontinuities again can confuse the operator as to their true amplitude and significance.

Another problem in using TDRs to test cables is the confusion that arises from higher order reflections. Higher order reflections are defined here as sensed energy pulses that are produced by multiple reflections from a single discontinuity. These multiple reflections can be falsely interpreted as additional cable discontinuities when in fact they are simply repeats of legitimate cable discontinuities.

SUMMARY OF THE INVENTION

It is an object of the present invention to provide a new and improved method for finding faults and/or splices in generally inaccessible cables.

It is a further object of the present invention to provide a new and improved fault and/or splice finding system.

It is a further object of the present invention to provide a new and improved fault finding system for finding faults in generally inaccessible cables which is highly accurate and which does not damage the cable.

It is a further object of the present invention to provide a new and improved fault finding system for finding faults in buried cables which is capable of pinpointing the position of a fault or splice, from above ground.

It is a further object of the present invention to provide new and improved fault finding apparatus which is much simpler to use.

It is a further object of the present invention to provide new and improved high voltage discharge apparatus.

It is a further object of the present invention to provide new and improved apparatus for coupling the fault finding apparatus and the discharge apparatus to a cable.

It is a further object of the present invention to provide a new and improved method and apparatus for sectionalizing an underground residential power system.

The above described problems and others are solved and the above objects and other objects are realized in a method of finding a fault in an electrical cable including the steps of introducing a pulsed electrical signal into a near end of an electrical cable, the pulsed electrical signal producing first, second and third pulses of electrical energy representative of the pulsed electrical signal, reflected electrical energy from a fault in the cable and reflected electrical energy from a far end of the cable, sensing, adjacent the near end of the cable, the first, second and third pulses and providing an indication of a time between the second and third pulses, moving along the electrical cable toward the far end and repeatedly sensing the time between the first and third pulses until a position at which the time between the first and third pulses is approximately equal to the indication of the time between the second and third pulses, and noting the position of the fault at the position along the electrical cable where the times are equal.

The above described problems and others are solved and the above objects and other objects are realized in a system for finding a fault in an electrical cable including signal generating apparatus providing a pulsed electrical signal, the signal generating apparatus being designed to be coupled to a near end of an electrical cable so as to introduce the pulsed electrical signal into the near end of the electrical cable, the pulsed electrical signal producing first, second and third pulses of electrical energy representative of the pulsed electrical signal, reflected electrical energy from a fault in the cable and reflected electrical energy from a far end of the cable, and a monitor having an input terminal coupled to the near end of the electrical cable in a first mode so as to sense the first, second and third pulses and provide an indication of a time between the second and third pulses, and coupled to an antenna in a second mode so as to repeatedly sense the time between the first and third pulses as it is moved along the cable until a position at which the time between the first and third pulses is approximately equal to the indication of the time between the second and third pulses.

BRIEF DESCRIPTION OF THE DRAWINGS

The foregoing and further and more specific objects and advantages of the present invention will become readily apparent to those skilled in the art from the following detailed description of the preferred embodiment thereof taken in conjunction with the drawings in which:

FIGS. 9–11 illustrate displays of responses received in the system of FIG. 1 when testing the electrical cable of FIG. 8 at three different positions;

FIG. 12 is a schematic diagram of a coupler utilized in conjunction with the system of FIG. 1;

FIG. 16 is a schematic/block diagram of high voltage generating apparatus utilized in conjunction with the system of FIG. 1.

DETAILED DESCRIPTION OF THE PREFERRED EMBODIMENT

Figure 1:
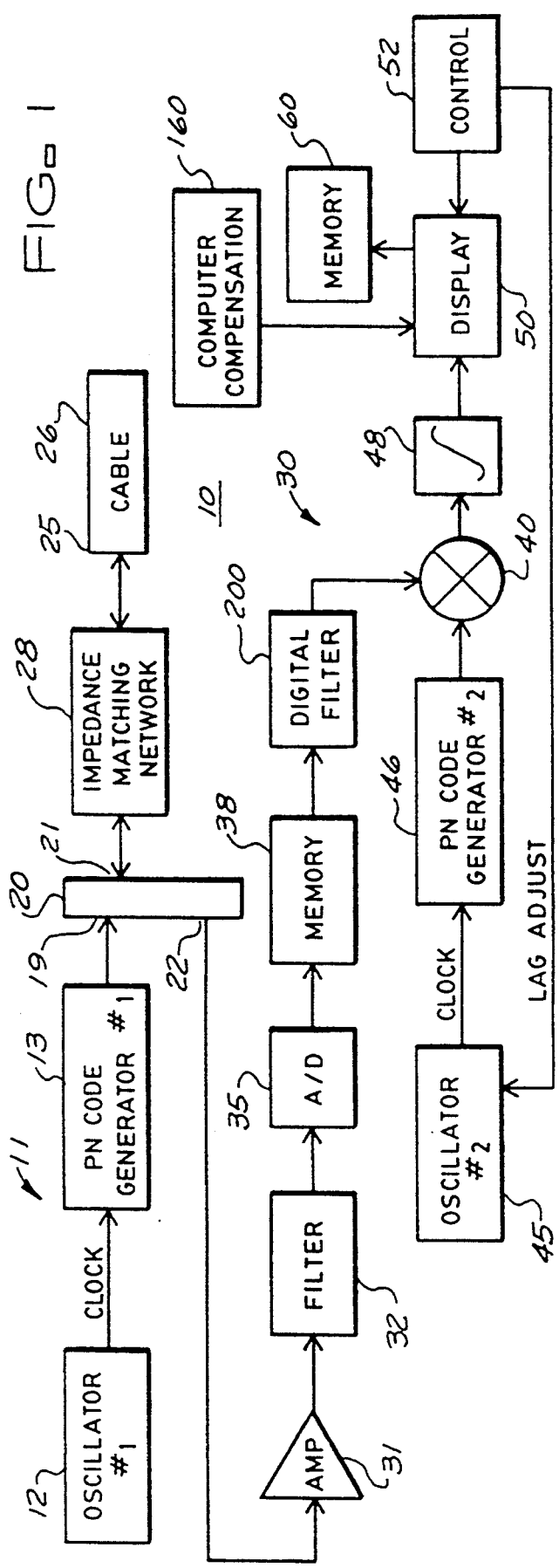
FIG. 1 is a block diagram of a fault finding system embodying the present invention.

FIG. 1 illustrates a block diagram of a fault finding system, generally designated 10, embodying the present invention. It should be noted that system 10 is a device for finding discontinuities in conducting cables and the like. Generally, for simplicity, this explanation refers to discontinuities as faults, although they may be splices, weakened areas, or other discontinuities, and to system 10 as a fault finding system. Also, while the electrical cables referred to herein are generally illustrated as buried power cables, it should be understood that any extended conductors can be tested, including overhead power cables, telephone lines, local area computer network cables, TV cables, etc. System 10 includes a signal generator 11 having a first oscillator 12 connected to provide a clocking signal to a pulse compression waveform generator, which in this specific embodiment is a pseudorandom noise (PN) code generator 13. It will be understood by those skilled in the art that many varieties of pulse compression waveforms, such as Linear FM (chirp radar), are possible and known in the art. In this particular embodiment oscillator 12 is a very stable crystal oscillator including dividing circuits to extend the range from approximately 1 MHz to approximately 1 GHz. As will be explained presently, it is advantageous to change the clocking rate of PN code generator 13 for different sizes and lengths of electrical cable. Therefore, the specific range utilized in this embodiment is applicable for the particular electrical system to be discussed, but other ranges may be utilized for this and/or other applications. Although many types of modulation can be used, PN code modulation is ideally suited for this application because it is easy to implement and long code lengths produce extremely high correlation gains. Using long, high-rate PN codes, extremely high resolution and sensitivity are obtained simultaneously.

Figure 2:
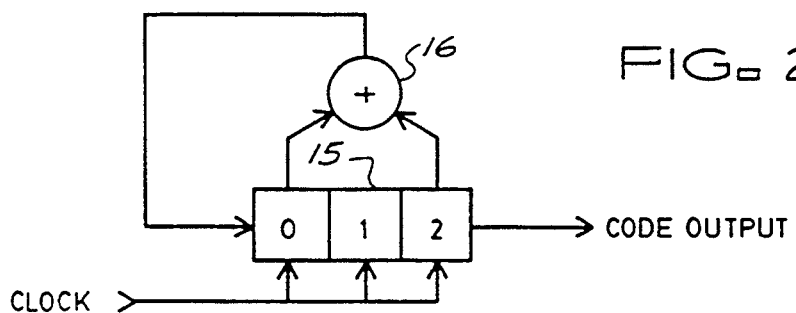
FIG. 2 is a block diagram of an example of a PN code generator.
Figure 3:
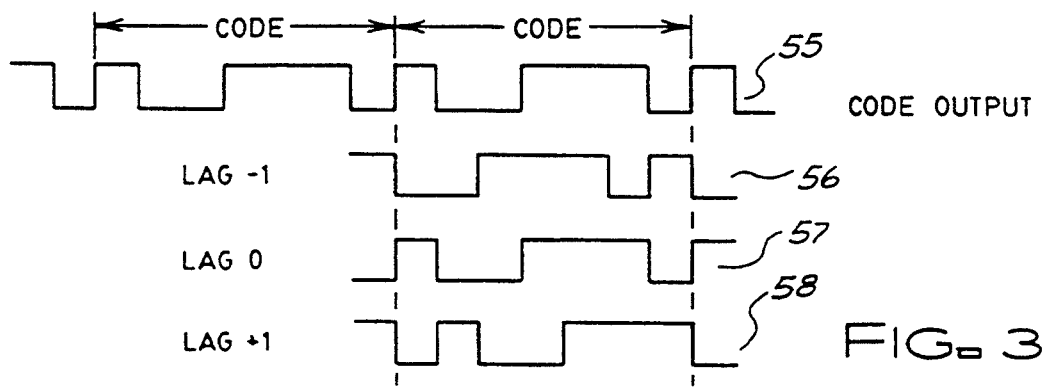
FIG. 3 illustrates an autocorrelation operation for the PN code generator of FIG. 2.

The basic principal of pulse compression using pseudorandom noise codes is illustrated in FIGS. 2–3. Referring specifically to FIG. 2, a 3-stage shift register 15 is connected to a MOD 2 adder 16 in a maximal-length configuration. In this simplified example, shift register 15 has three, one bit delay stages, 0, 1 and 2. The 0 and 2 bit stages are connected to provide inputs to adder 16 and an output of adder 16 is connected to the input of shift register 15. A clock input from, for example, oscillator 12 is supplied to each stage. The 3 bit delay stage provides a seven chip, $2^n-1$, length code as an output of the generator, which is illustrated in FIG. 3. In system 10, PN code generator 13 is constructed to produce a PN code in the range of one thousand (1K) to one million (1M) chips in length. As will be explained in more detail presently, using long, high-rate PN codes increases the resolution and sensitivity of system 10. For example, using a one million chips (1M) long code at a 4 nanosecond chip rate (250 MHz), a resolution of one foot can be obtained along with a processing gain of 60 db. However, as the length and other characteristics of the electrical cable changes, it is desirable to vary the length of the PN code and the chip rate because of cable attenuation and propagation differences. Therefore, the specific PN code lengths and chip rates utilized in this embodiment are applicable for the particular electrical system to be discussed, but other ranges may be utilized for this and/or other applications.

Referring again to FIG. 1, the output from PN code generator 13 is supplied to an input terminal 19 of a power splitter 20. Power splitter 20 is a common RF power splitter, directional coupler, or similar power dividing or directing network, which, by means of electrical positioning in a well known manner, provides substantially all of any RF power supplied to input terminal 19 at an input/output terminal 21. Further, power supplied, externally, to input/output terminal 21 is coupled to output terminal 22, and, while (in some embodiments) this power may actually be split between terminals 19 and 22, the only power of interest is the power supplied to output terminal 22. Input/output terminal 21 is coupled to a near end 25 of an electrical cable 26, to be tested, by an impedance matching network 28. Generally, impedance matching network 28 is designed to match the impedance of system 10 to the impedance of cable 26 to get the most efficient transfer of energy therebetween. While impedance matching network 28 can be virtually any network that couples energy to and from cable 6, a specific embodiment of an impedance matching network utilized in the present structure will be described presently.

Output terminal 22 of power splitter 20 is coupled to an input terminal of a monitor, generally designated 30. Thus, as stated above, power reflected from cable 26, through impedance matching network 28, to input/output terminal 21 of power splitter 20 is coupled to output terminal 22 and monitor 30. Input signals applied to the input terminal of monitor 30 are coupled through an appropriate amplifier 31 and filter 32 to an analog to digital (A/D) converter 35. Amplifier 31 and filter 32 are included simply to achieve the required amplitude of signal for the further processing to be explained and to eliminate any extraneous interference that may be present. Further explanation of these components is not necessary since they will be understood by those skilled in the art. A/D converter 35 is included to convert the signal received from cable 26 by way of output terminal 22 of power splitter 20 into clear chips of PN code. Because of cable attenuation and the effects of distributed capacitance and inductance, the signal originally applied to near end 25 of cable 26 is generally degraded to some extent and may be buried in the broadband noise of amplifier 31. By applying the received signal to A/D converter 35, the signal is converted back to substantially the original content (plus broadband noise), only delayed by the travel down cable 26. Digital signals from A/D converter 35 are stored in a high speed memory 38 for subsequent processing and display. Stored signals from memory 38 are applied to a first input of a multiplier circuit 40.

A second oscillator 45 is a very stable crystal oscillator similar to, and operating at the same frequency as, first oscillator 12. Separate oscillators 12 and 45 are utilized in this embodiment because monitor 30 is moved from the immediate location of signal generator 11 during testing of cable 26, as will be described presently. It should be understood, however, that a single oscillator, or a master/slave arrangement could be utilized in some specific applications. The output of oscillator 45 is applied as a clocking signal to the input of a PN code generator 46, which supplies a PN code that is identical to, and initially substantially in phase with, the PN code supplied by PN code generator 13. The PN code from PN code generator 46 is coupled to a second input of multiplier 40. The two signals coupled to the first and second inputs of multiplier 40 are multiplied together and the product is integrated in an integrator 48. The output of integrator 48 is supplied to an input of a display 50. A control 52 is connected to oscillator 45 to automatically adjust a lag in oscillator 45, one A/D sample at a time. Here it should be noted that approximately 2-16 samples per chip are taken. Simultaneously, the output of control 52 is supplied to display 50 to continuously update the display, indicating the amount of lag being introduced, as a new lag is introduced into oscillator 45. This process is referred to as autocorrelation and will be understood more clearly from the simplified example of FIGS. 3 and 4.

Figure 4:
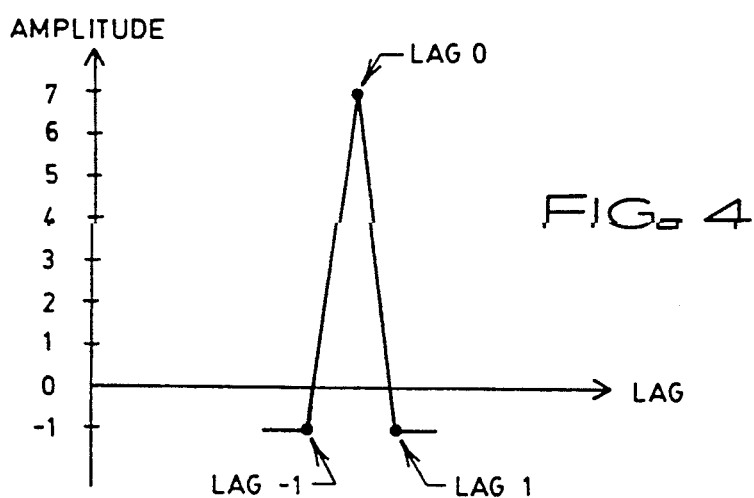
FIG. 4 illustrates, graphically, the autocorrelation response for the operation of FIG. 3.
Figure 5:
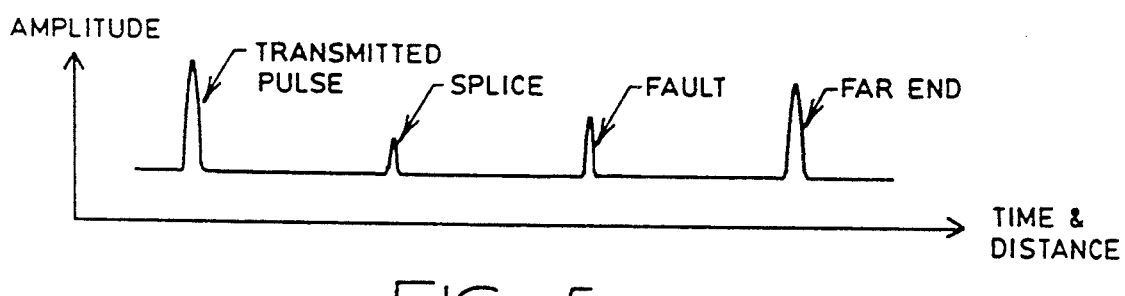
FIG. 5 illustrates a cable return typical trace appearing on the apparatus of FIG. 1.

In FIG. 3, waveform 55 illustrates two complete cycles of the simple 7 chip code generated by the PN code generator of FIG. 2. Waveform 56 illustrates a similar 7 chip PN code with a one chip lag, waveform 57 illustrates a similar 7 chip PN code with no lag and waveform 58 illustrates a similar 7 chip PN code with a one chip lead. FIG. 4 illustrates the amplitude of the signal generated by autocorrelation of each of the signals represented by waveforms 56-58 with the original signal of waveform 55. It should be noted that a sharp power peak appears when the two signals are in phase (zero lag). Also, it should be noted that the peak is better defined as more samples per chip are taken, within a reasonable amount. For example, in the present embodiment approximately 2-16 samples per chip are taken with most common amount being approximately 4 samples per chip. Referring back to FIG. 1, it will be readily understood by those skilled in the art that when the signal generated by PN code generator 46 exactly correlates (zero lag) with the delayed signal received from cable 26 a peak of power will appear and be displayed by display 50. By utilizing the lag signal from control 52 to create a trace on display 50, the relative positions of the power peaks will be illustrated in a correct time relationship. To better understand this concept, a typical return trace from cable 26 is illustrated in FIG. 5.

When the signal generated by PN code generator 13 is originally applied to near end 25 of cable 26, a portion of that signal is digitally processed and supplied to the first input of multiplier 40. The portion of the original signal is reflected from the discontinuity presented by near end 25 of cable 26. This signal should have zero lag when correlated with the signal generated by PN code generator 46 and, therefore, produces a peak of power, designated the transmitted pulse, in FIG. 5. Smaller return signals may be, for example, reflected from a splice in cable 26, a low resistance fault in cable 26 and, finally, from the far end of cable 26. All of this information is stored in memory 38 for the subsequent processing. After the initial transmitted pulse, control 52 introduces a lag into oscillator 45, one A/D sample at a time and gradually produces a trace on display 50, one A/D sample at a time. For each lag of one sample, the output of PN code generator 46 is compared, or correlated, with the signal from memory 38. Each time that a return, or reflection, is present, a peak of power appears so that, as the autocorrelation progresses, a peak appears for the reflection from the splice, for the reflection from the fault and for the reflection from the far end of cable 26. If the trace is allowed to continue, second and even third reflections of the initial transmitter pulse from near end 25 and the far end of cable 26 and, possibly other reflections, may appear.

Figure 6:
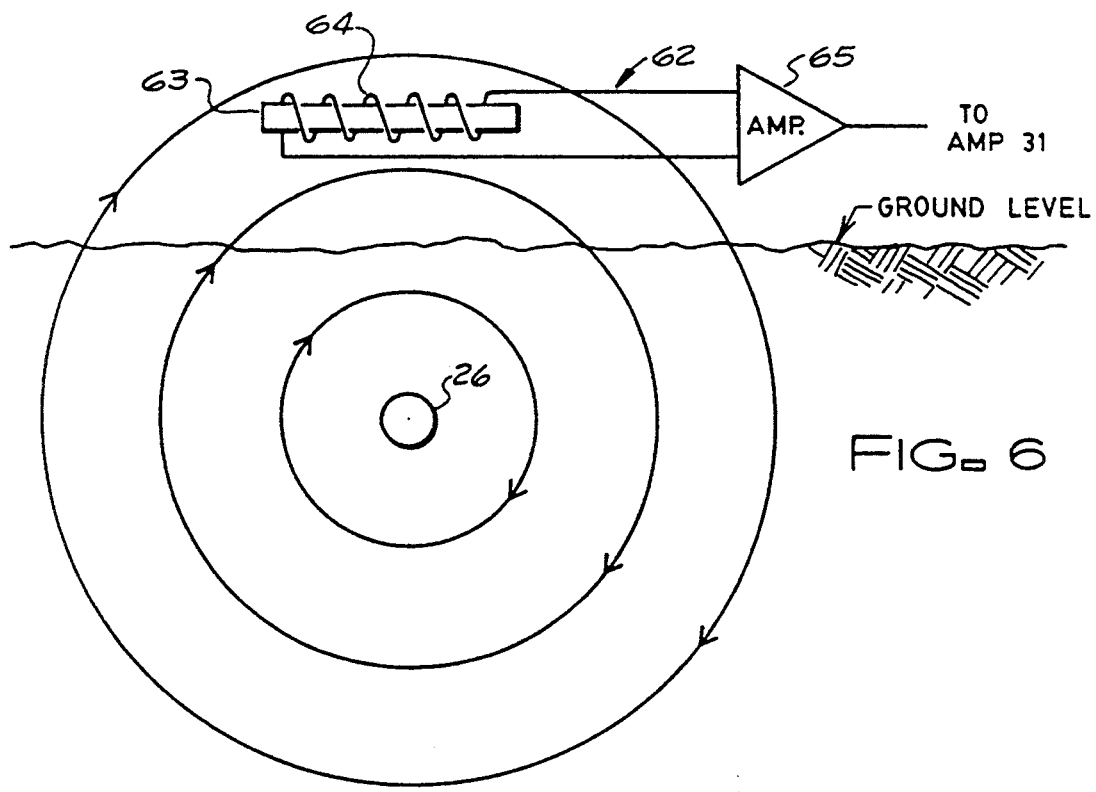
FIG. 6 is a schematic/block diagram of an antenna used in conjunction with the system of FIG. 1, illustrating the approximate relation to a buried electrical cable.
Figure 7:
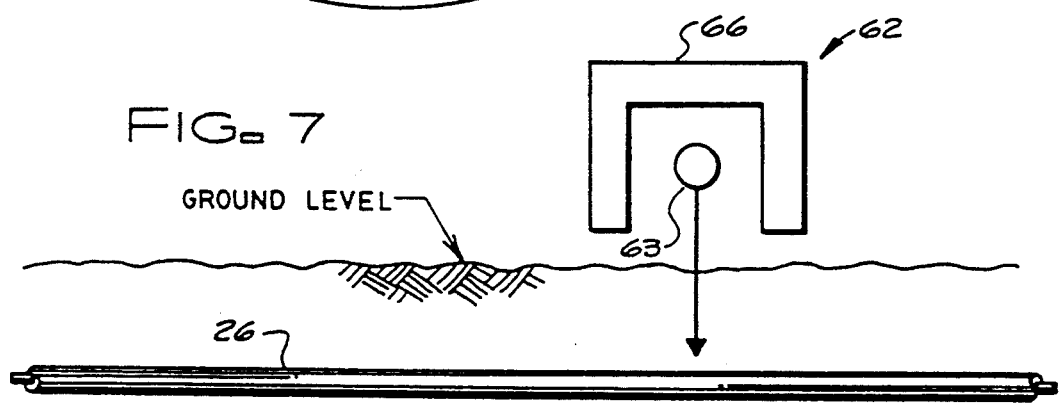
FIG. 7 is an end view of the antenna of FIG. 6 illustrating the construction thereof.
Figure 9:
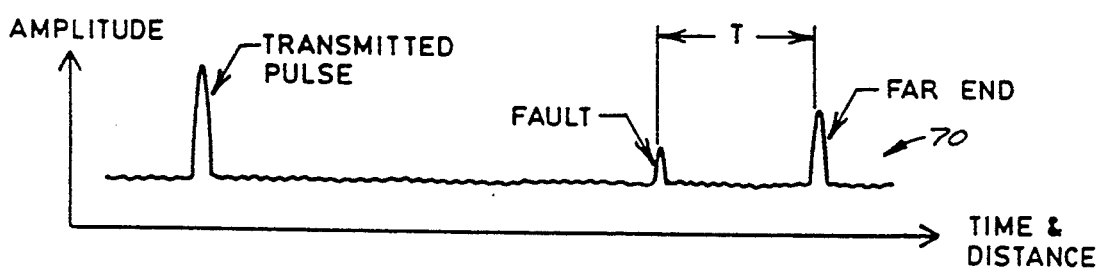

In this specific embodiment, once an initial trace of cable 26 is received, it is stored in a second memory 60, attached to, for example, display 50. Monitor 30 is then disconnected from output terminal 22 of power splitter 20 and attached to an antenna. Because the PN code signal applied to cable 26 is an RF signal, there is a relatively substantial leakage of the signal into the surrounding area, generally in the form of a magnetic field surrounding the cable and changing with the passage of the signal down the cable. This signal can be picked up by a properly designed antenna with a relatively flat broadband frequency response to magnetic fields. A specific antenna 62 designed for this purpose is illustrated in FIGS. 6 and 7. Antenna 62 includes an elongated ferrite rod 63 having a few turns of wire 64 therearound, with opposite ends of wire 64 attached to two inputs of a transimpedance amplifier 65. Transimpedance amplifier 65 is a wideband amplifier and, through a proper selection of the size and material of ferrite rod 63, proper winding of wire 64, and careful circuit layout, antenna 62 has a flat broadband frequency response, in this embodiment greater than 100 MHz, to magnetic fields. The design of this structure should be well within the purview of those skilled in the art.

To improve the directional reception of antenna 62, an elongate shield 66 having a generally U shaped cross-section and open ends is affixed over rod 63 with an open side directed downwardly, as illustrated in FIG. 7. Shield 66 is made of an electrically conductive material, such as aluminum (which is also light weight), so as to attenuate all magnetic fields except those emanating from directly below antenna 62. This substantially reduces the sensitivity of antenna 62 in all directions other than straight down. In operation, antenna 62 is oriented over cable 26 so that rod 63 is generally directly above and perpendicular to cable 26.

Figure 8:
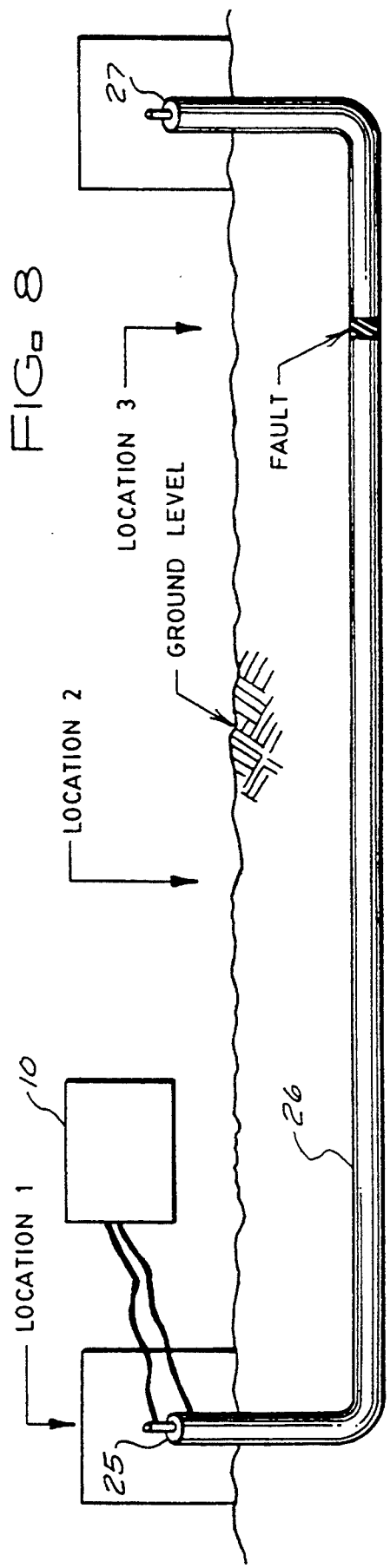
FIG. 8 illustrates a section of buried electrical cable.

The operation of fault finding system 10 will now be described in conjunction with a buried power cable which, for continuity of this disclosure, is designated 26, with a near end 25 and a far end 27. Cable 26 is illustrated in FIG. 8 and is situated between two padmount transformers of the type normally used in suburban power distribution systems. As previously explained, both signal generator 11 and monitor 30 of system 10 are connected to near end 25 of cable 26 to supply a PN code signal thereto and receive an initial trace 70. Initial trace 70 is stored in memory 60 for further reference, if desired. Also, the time, T, between a received fault pulse and the pulse from far end 27 of cable 26 are specifically noted, or indicated. The indication of time T can be provided in a variety of ways as, for example, initial trace 70, which is stored in memory 60, can be continuously displayed on display 50 with subsequent traces offset for ease in viewing and comparison. In addition to, or instead of, initial trace display 70, an actual time T, for example in terms of the number of A/D samples, or chips between the pulses, can be displayed for the operator. Since the time of an A/D sample, or chip, is known from the operating frequency of oscillators 12 and 45, the time can be easily calculated in actual time from the number of chips. Thus, a large variety of displays are available for system 10 through the use of well known and easily constructed apparatus.

Once the time T is known, monitor 30 is disconnected from power splitter 20 and antenna 62 is attached to the input of amplifier 31. Here it should be noted that in some specific instances it may be possible and/or practical to couple monitor 30 to near end 25 through antenna 62 for obtaining initial trace 70, rather than removing antenna 62 and connecting the input of amplifier 31 to power splitter 20. Signal generator 11 remains attached to near end 25 of cable 26 and PN code signals are continuously applied thereto. An operator walks along cable 26 to some intermediate position, designated location 2 in FIG. 8, and positions antenna 62 perpendicular to cable 26, as illustrated in FIGS. 6 and 7. A second trace 71 is developed similar to the way that initial trace 70 was developed. In second trace 71, the transmitted pulse will produce a strong pulse as it passes position 2, prior to any reflections. Also, a strong pulse will be present from the reflection of the PN code signal from far end 27 of cable 26. Other signals and reflections may be present but these two pulses will generally be the strongest and easily recognized. By noting time, t, between the transmitted pulse and far end pulse and comparing time t to time T, the operator can approximately determine how far he is from far end 27 of cable 26. A plurality of readings are taken as the operator moves along cable 26 until the operator reaches location 3 at which position time t is exactly equal to time T, as illustrated in FIG. 11 waveform 72. At this point, the operator is standing exactly above the fault.

By utilizing the frequency of oscillators 12 and 45, and by knowing the approximate propagation velocity of cable 26, the remaining distance to the fault for each location at which the operator makes a reading, can be quickly calculated and displayed for the operator. As the fault location is approached, the remaining distance display will approach zero and then increase in the negative direction. Maximum fault location accuracy is obtained by averaging the locations indicated on both sides of the fault along with the zero location. For example, if the point halfway between the plus and minus 5 feet remaining locations is averaged with the point halfway between the plus and minus 10 feet locations, the exact fault location is found with great accuracy. By performing this averaging technique, the effects of localized signal perturbations and minor measuring errors are minimized.

In some specific areas where the electrical cable meanders large amounts and the cable is difficult to follow, auxiliary tone generator signals are applied to the electrical cable along with the PN code signal. A crossed loop receiving antenna is used to receive the auxiliary tone to indicate the direction to the cable path. Such an arrangement is used at the present time to find underground cables, pipes, etc. Utilizing this feature, as monitor 30 is moved along the cable path, signal strength and direction to the cable path is continuously indicated on display 50 to help guide the operator along the cable path. In this way the operator can designate the exact position of the fault in the cable both laterally and axially. Alternately, antenna 62 can be rotated 90 degrees so that ferrite rod 63 is oriented vertically, relative to the ground. As antenna 62 is positioned laterally, directly over the cable, a sharp null in received signal strength will be obtained, generally in the same manner as obtained with a vertically oriented tone generator antenna. Thus the lateral position of the cable is accurately determined.

Referring specifically to FIG. 12, one embodiment of impedance matching network 28 is illustrated. In this specific embodiment of network 28 the PN code signal is supplied from power splitter 20 by means of an RF coaxial cable 75. The inner conductor and outer shield of cable 75 are connected to opposite sides of the primary of an RF isolation transformer 78. One side of the secondary winding of transformer 78 is connected to ground and the other side is connected through a dc blocking capacitor 79 to the anode of a high voltage diode 80. The cathode of diode 80 is connected to the center conductor of electrical cable 26 at near end 25. A dc bias voltage is connected to the anode of diode 80 by means of an RF choke 81, which is utilized to prevent the PN code (RF) signal from being shorted out by the bias supply. Also, a high voltage terminal for the application of a high voltage to near end 25 (for reasons to be explained) is connected through an RF choke 82 to near end 25 of cable 26. RF choke 82 prevents the PN code (RF) signal from being shorted out by the high voltage supply. Capacitor 79 is a small low voltage RF capacitor that isolates the bias voltage from the PN code signal input. Transformer 78 matches the impedance of coaxial cable 75 (typically 50 ohms) to the impedance of electrical cable 26 (typically 35 ohms). While transformer 78 is not necessary to the operation of network 28, it does have a useful matching characteristic. However, other forms of RF impedance matching networks, including the direct connection of capacitor 79 to the input, can be used.

Figure 13:
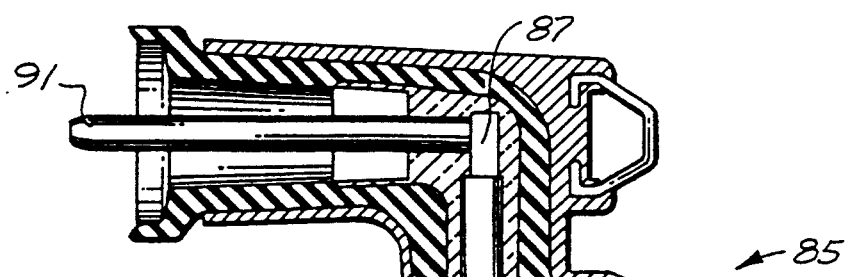
FIG. 13 is a sectional view of a loadbreak elbow utilized in coupling electrical power cables.
Figure 14:
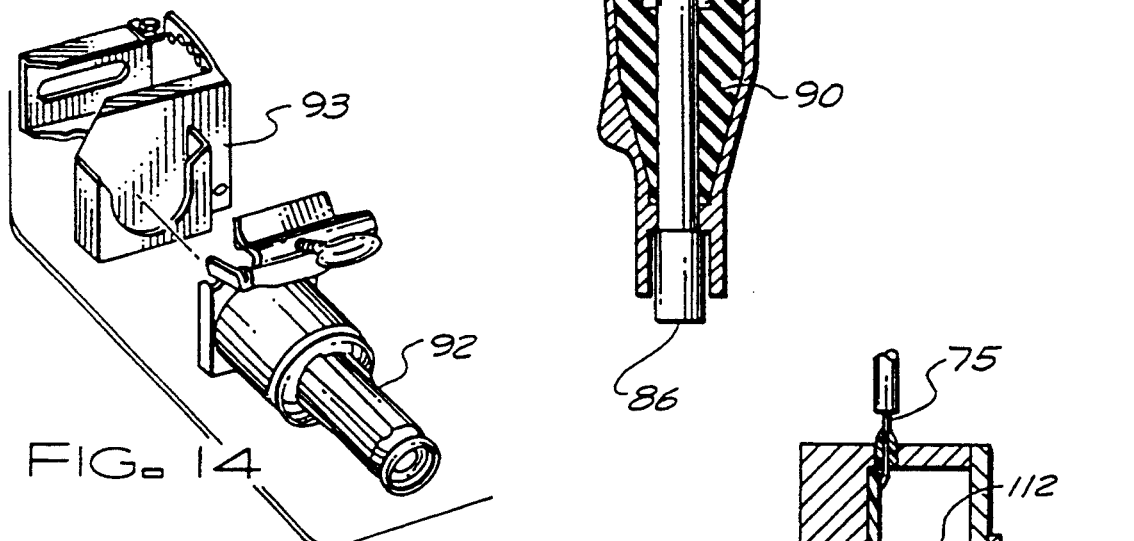
FIG. 14 is an exploded view of a parking stand and insulated parking bushing utilized in conjunction with the loadbreak elbow of FIG. 13.

Underground residential power distribution systems typically consist of groups of padmount transformers, such as the padmount transformers illustrated in FIG. 8, connected together with underground distribution cables. Typically the underground distribution cables carry up to thousands of volts. The padmount transformers, situated above ground in backyards, alleys, etc. reduce this power to 120 volts and it is conveyed to each adjacent house from there. The underground distribution cables usually terminate in a loadbreak elbow which mates with a transformer bushing attached to the transformer (not shown). A loadbreak elbow 85 (which is commercially available) is illustrated in FIG. 13, attached to a near end of an underground distribution cable 86. Cable 86 is similar to a coaxial cable in that it contains a center conductor 87 and a concentric neutral. The concentric neutral is formed by a plurality of wires spiralling or helically wound around a dielectric surrounding center conductor 87 and insulating center conductor 87 from the shield. A sheath of solid dielectric material usually surrounds the concentric neutral and protects the entire cable from the elements. The outer sheath of dielectric material is stripped from approximately one foot of the end of cable 86 and the wire shield is untwisted. So prepared, the final foot of cable 86 is inserted into an opening in the lower end of loadbreak elbow housing 90 and the free end of the shield is connected to a ground connection external to housing 90. Finally, a portion of the insulation adjacent to center conductor 87 is removed to provide a connection point for probe 91. The center conductor is fixedly attached to the solid electrically conducting probe 91, which is designed to mate with an opening in the transformer bushing When maintenance people want to test the cables and/or padmount transformer, loadbreak elbow 85 is disengaged from the transformer bushing and engaged in an insulated bushing 92, illustrated in FIG. 14, which is not connected to anything but which insulates and protects probe 91 of loadbreak elbow 85. Insulated busing 92 is then "parked" in a parking stand 93 which is fixedly attached within the padmount transformer. This prevents loadbreak elbow 85 from inadvertently touching live wires while the maintenance people are working. One of the problems with loadbreak elbow 85, when it is utilized as the input (near end) of the electrical cable for purposes of PN code signals, is that the entire main conductor, including center conductor 87 and probe 91, are unshielded. This substantial length of unshielded conductor provides an impedance mismatch that produces a large insertion loss and other problems.

Figure 15:
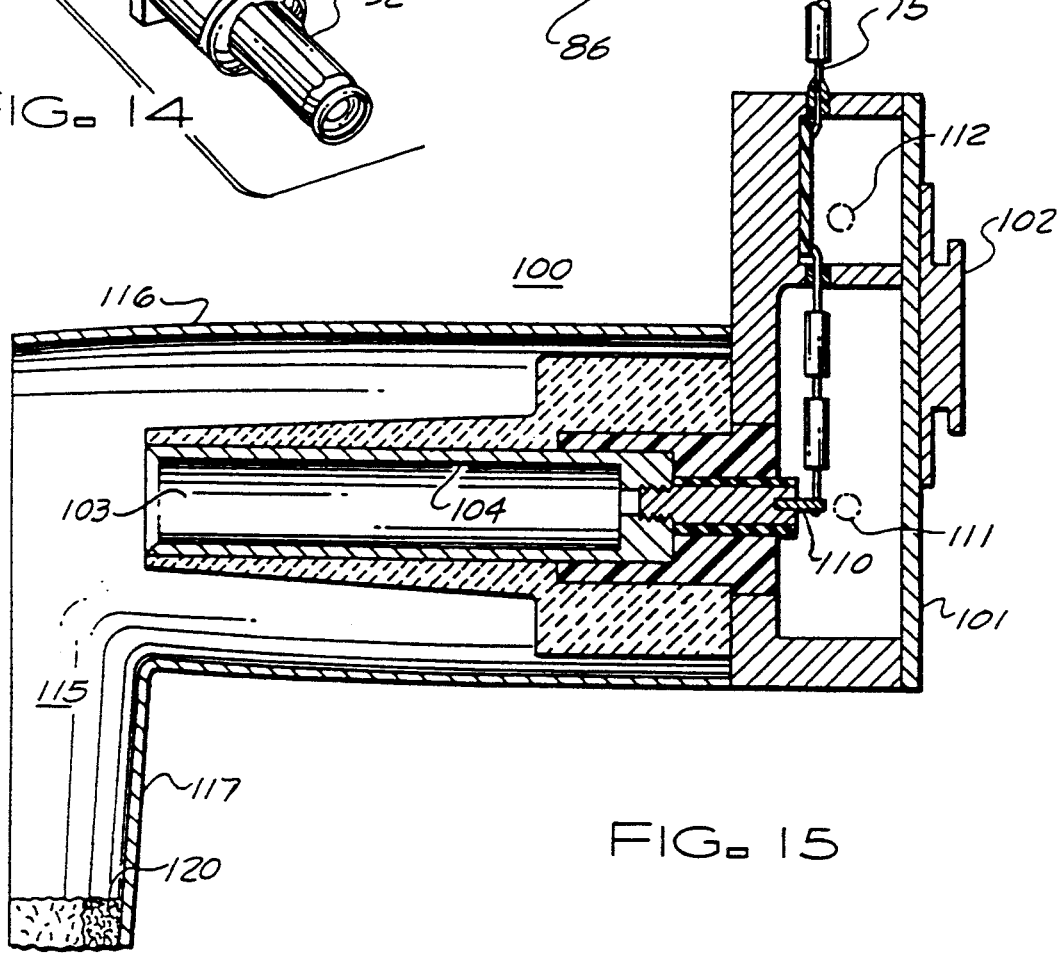
FIG. 15 is a sectional view of a coaxial coupler utilized in conjunction with the system of FIG. 1.

To solve the impedance mismatch problem, a coaxial coupler 100 is provided, as illustrated in FIG. 15. Coupler 100 includes a generally box shaped housing 101 having a parking stand hardware mate 102 affixed to the outer surface of one major side thereof. Hardware mate 102 is designed to mate with parking stand 93 (FIG. 14) to hold the entire coupler 100 for convenient connection. The major surface of housing 101, opposite hardware mate 102, has an insulated parking bushing 92 fixedly attached thereto so that a probe engaging opening 103 is externally accessible. An internal conductive sleeve 104 within opening 103 is internally connected to a terminal 110 within housing 101. A feedthrough terminal 111 is provided in a top surface for the connection of high voltage generator thereto. Feedthrough terminal 111 is illustrated in broken lines, since the upper surface of housing 101 is removed to make the inside visible. The circuit of impedance matching network 28 is mounted within housing 101 with terminal 110 being the near end of the electrical cable and coaxial cable 75 fixedly engaged through the wall of housing 101 farthest from terminal 110. A bias feedthrough terminal 112 is provided in the top surface for connection of the dc bias voltage. Feedthrough terminal 112 is also illustrated in broken lines. Coupler 100 is designed so that it is easily positioned in parking stand 93 and loadbreak elbow 85 is easily engaged therein for connection of cable 86 to impedance matching network 28.

A cylindrical, generally elbow shaped metal shroud 115 is fixedly attached to housing 101 so that one section 116 of elbow shaped shroud 115 substantially surrounds and shields insulated parking bushing 92 while leaving opening 103 externally accessible. The perpendicular section 117 of shroud 115, which is generally semicylindrical, extends downwardly so as to nestingly receive the cable engaging portion of loadbreak elbow 85 therein. Section 117 is long enough to both enclose loadbreak elbow 85 and the first few inches of cable 86. A flexible metal mesh 120 is attached to the inside surface of section 117 of shroud 115 at approximately the area where the shield of cable 86 is dressed out for a ground connection in loadbreak elbow 85. Shroud 115 is constructed of aluminium or the like so as to forth a good ground connection with the shield of cable 86. Thus, the entire loadbreak elbow 85 is shielded and the impedance mismatch is substantially reduced or eliminated.

System 10 previously described is utilized to locate low resistance faults, opens, splices, and the like. To locate high resistance faults a single shot high voltage dc generator 130, illustrated schematically in FIG. 16 is utilized in conjunction with impedance matching network 28. Generator 130 includes a high voltage power supply 132 and a low voltage power supply 133. High voltage power supply 132 provides at least 25 thousand volts and may be variable to higher and lower voltages if desired. Low voltage supply 133 provides approximately 200 volts and again may be variable over a range of voltages if desired. A high voltage capacitor 134 is connected between the output of high voltage supply 132 and ground. The output of high voltage capacitor 134 is connected though a relay, or high voltage switch 135 to an output terminal 136. A low voltage capacitor 140 is connected between the low voltage supply and ground. The output of low voltage capacitor 140 is connected through a current source 141 to the anode of a high voltage diode 145. The cathode of diode 145 is connected between high voltage capacitor 134 and relay 135. A manual safety switch 146 is connected between output terminal 136 and ground.

In operation, high voltage generator 130 is used in what is commonly known as the arc reflection method of locating faults in underground distribution cables. In the prior art arc reflection method, a high voltage pulse up to 25 KV is used to breakdown the defective cable and form a low impedance arc at the fault site. Simultaneously with the application of the high voltage pulse, a low voltage time domain reflectometry or RADAR pulse is transmitted down the defective cable. When the low voltage pulse arrives at the fault, it is reflected back since the arc is nearly a short circuit. High voltage generator 130 is constructed from the recognition that there are two separate functions to perform. The first function is to initiate the arc and the second function is to maintain the arc for a long enough period of time to collect reflection signals.

High voltage power supply 132 charges high voltage capacitor 134 up to as high as 25 KV or more. Capacitor 134 is only a few tenths of a microfarad and is used to simply supply enough energy to initiate an arc in cable 86 at the fault site. Low voltage power supply 133 charges low voltage capacitor 140 up to approximately 200 volts. Capacitor 140 is typically a few thousand microfarads and is discharged through current source 141 to maintain the low voltage arc in cable 86 once it is initiated by the energy in capacitor 134. Before the high voltage breakdown in cable 86 occurs, diode 145 is back-biased and isolates the high voltage circuit from the low voltage circuit. Once breakdown occurs, capacitor 134 quickly discharges because it is very small and the arc at the fault site is very low impedance. As the voltage on capacitor 134 drops below the voltage on capacitor 140, diode 145 becomes forward-biased and capacitor 140 automatically begins to discharge through current source 141. This discharge current is typically a few amps and acts to maintain the discharge arc in cable 86 at the fault site.

The primary purpose of current source 141 is to limit the initial discharge current and to allow a small low voltage capacitor to be used. Current source 141 does this by only allowing a constant amount of power to be discharged from capacitor 140. If current source 141 were not present, the initial discharge current would be very high and would exponentially decay with time until capacitor 140 was totally discharged. Since the arc requires a few amps to be maintained, the initial voltage or capacitance (or both) in a single supply generator would have to be very large to obtain the required arc voltage and to provide sufficient current to maintain the arc until the end of the desired discharge period.

Referring back to FIG. 12 and impedance matching network 28, the operation of this circuitry can now be explained in more detail. The high voltage from high voltage generator 130 at output terminal 136 is connected to the high voltage terminal of network 28. The high voltage on the high voltage terminal is isolated from the RF circuit by high voltage diode 80. If the fault is a low resistance fault or the like, high voltage generator 130 is not energized, and relay 135 remains open and manual safety switch 146 is closed. In this mode, diode 80 is forward biased by bias current flowing through RF choke 81, diode 80, RF choke 82 and manual safety switch 146. With diode 80 forward biased, the PN code signals pass through diode 80 into cable 26. Manual safety switch 146 acts both to make system 10 safe, when a high voltage discharge is not being applied, and to provide a return path for the bias current in mode 1 when monitor 30 is attached to power splitter 20 and in mode 2 when monitor 30 is attached to antenna 62. When the fault is a high resistance fault, as previously explained, high voltage generator 130 is energized and a high voltage is applied to the high voltage terminal of network 28. When the high voltage is applied to network 28, diode 80 becomes back-biased and prevents current flow into the RF portion of network 28. When cable 26 (or 86) undergoes high voltage breakdown and arcs, the voltage on cable 26 drops to the arc potential, which is typically under 50 volts. At this time, diode 80 is forward-biased by the bias voltage applied through RF choke 81 and the low arc impedance at the fault site and forms a low impedance path for the PN code signal from transformer 78. That is, diode 80 acts as a switch that automatically engages at the instant of cable breakdown.

The main advantages of this circuit is that diode 80 is a small low cost component that is easily integrated into a broadband circuit structure, and the reverse capacitance of diode 80 is very small. This low capacitance minimizes the amplitude of the high voltage pulse coupled into the RF circuit at the instant of cable breakdown.

Using the present system, it is no longer necessary to precisely track and tape measure the physical distance along the cable path to determine the approximate location of the fault reflection. Instead, it is sufficient to simply "walk" over to the approximate location of the fault reflection (as indicated on display 50) and note the distance remaining to the fault location (as indicated on display 50). When the distance remaining is zero feet, monitor 30 and/or antenna 62 is precisely above the cable fault location.

To locate high resistance faults, signal generator 11 is combined with high voltage generator 130. Monitor 30 contains sufficient storage capacity in memory 38 to take a snapshot of the reflected pulses (similar to FIG. 5) during the high voltage discharge arc. The low resistance arc fault is thus captured by monitor 30 when it is physically connected to near end 25 of cable 26 through power splitter 20 and the time T will be indicated. The location of the discharge fault is then found in the same manner as were low resistance faults and splices. It is not generally necessary to apply a high voltage discharge to the cable more than once to find and mark the high resistance fault location.

Since only one high voltage discharge is required, a physically large thumper is not required. Current art also only requires that a single high voltage discharge be used to indicate the fault location on the most modern TDRs. However, once crews are positioned in the approximate fault location (as indicated on the TDR) the thumper is turned on again so that the crew can pinpoint the fault location by listening for the audible arc discharge. Typically, the thumper arcs the cable every 1 or 2 seconds over a 5 to 15 minute search period, which can damage the cable and hasten subsequent faults.

The present system eliminates the need for a physically large thumper unit and prevents the damaging effects of over thumping the cable, because a thumper is not required to pinpoint the fault location. The fault is pinpointed by receiving normal low voltage electrical pulses via system 10. It is not necessary to produce an audible discharge arc. Therefore, a physically small man-portable low-current, low-repetition-rate high-voltage discharge device is used.

Figure 17:
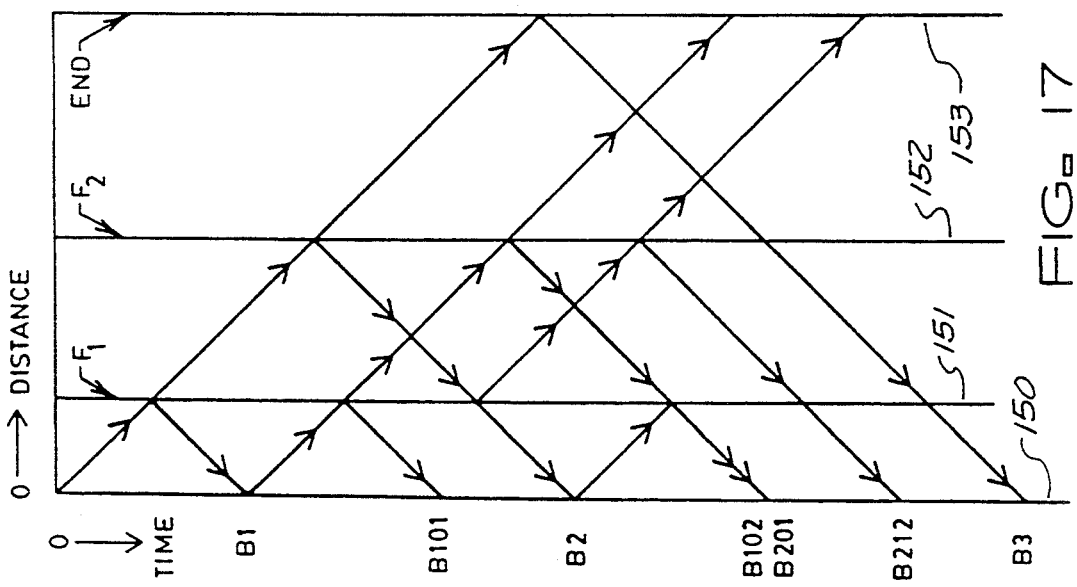
FIG. 17 is a distance versus time reflection diagram for a typical electrical cable.

The problems of high order pulse reflections and cable attenuation are solved in the present equipment as follows. High order reflections are best understood by referring to FIG. 17, which is a distance versus time reflection diagram for a typical electrical cable. In FIG. 17, the horizontal axis represents distance along the cable and the vertical axis represents time after initiation of a pulsed electrical signal into the cable. The beginning of the cable under test, two cable faults (or discontinuities), and the end of the cable are also represented by vertical lines 150, 151, 152 and 153, respectively.

At time zero and distance zero, a radar signal is transmitted which propagates down the line at a velocity determined by the cable under test. Generally, the propagation velocity of cables is well known or can be obtained from the manufacturer of the cable. The propagation velocity of the cable under test is represented by diagonal lines in FIG. 17. When the pulsed electrical signal applied to the near end of the cable strikes the first fault (line 151), a portion of the energy of the applied signal is reflected while the remainder of the energy continues down the cable. The reflected energy from the first fault strikes the near end of the cable at time B1 and is recorded on display 50 of monitor 30. Upon striking the near end of the cable, some of this reflected energy from the first fault is reflected back down the cable where it is again reflected by the first fault and appears on display 50 as pulse B101. The 101 designation indicates a three bounce higher order pulse in which the pulse is produced by reflections from discontinuities 1 (fault 1), 0 (near end of cable) and 1, respectively- FIG. 17 illustrates all of the reflections that will be obtained prior to receiving the reflection from the far end of the cable, assuming that reflections of order greater than 3 are insignificant.

System 10 compensates for both cable attenuation and higher order reflections by computer processing, in computer compensation apparatus 160 (FIG. 1), of the raw reflections as presented on display 50. Cable attenuation is compensated for by increasing the amplitude (amplification) of the pulses with range. That is, the amplitude of the pulses is increased by X db/ft where X is the empirically derived cable attenuation per foot for the cable type under test and for the pulsed electrical signal parameters being used. For example, the amplification is increased for each chip, or fixed group of chips, supplied to display 50 by control 52 by some fixed amount. Attenuation due to discontinuities is compensated for by a step increase in the pulse amplitudes displayed beyond the point of discontinuity. This amplification is only performed for targets due to first order reflections. In the present embodiment, the amplification is only applied after pulses due to higher order reflections have been eliminated. The amount of amplification step is proportional to the amplitude of the reflected pulse. That is, strong pulse returns indicate that significant energy has been reflected, thus leaving less energy available to propagate further down the cable. Therefore, pulses appearing at further ranges require larger amplification factors to convert further returns to their true value.

Pulses from higher order reflections are eliminated, or greatly attenuated, by weighting pulses at the expected multiple reflection locations by an appropriate amount. In this way, if a legitimate pulse occurs at these distances, it will not be eliminated. If pulses at the expected multiple reflection locations are simply eliminated, rather than reduced by weighting, some legitimate pulse could be inadvertently lost. The weighting can be performed empirically with some simplified tests on known cables, or various algorithms for dealing with multiple reflections as described in the literature, for example in conjunction with sonar or acoustic radars and the like. In particular, similar algorithms are routinely used in oil exploration activities where acoustic radar is used to map underground soil and rock formations.

System 10 is utilized in a high resolution compensation mode by switching a digital filter 200 (see FIG. 1) into the path between the return signals from memory 38 and multiplier 40. Digital filter 200 is part of the cable attenuation and reflection compensation technique described above and will generally only be utilized for relatively long range testing, i.e. ranges of several hundred feet to miles. Generally, digital filter 200 will only be used when the highest resolution is desired and, due to the extensive processing required, may only be used off line, i.e. the A/D samples may be copied to a file and processed later. At high PN code frequencies and long cable runs, the high frequency portion of the PN code spectrum is severely attenuated. This causes the triangular autocorrelation peak (see FIG. 4) to become rounded, decrease in amplitude, and to spread out over a width of several chips. Once this happens, simply amplifying the displayed pulsed with range, as described above in conjunction with computer compensation 160, will not undo this loss of resolution. However, resolution similar to that obtained at short ranges, can be obtained at long ranges by digitally filtering the A/D samples with a digital filter that has higher gain at higher frequencies. That is, digital filter 200 compensates for the increased attenuation in the cable with frequency.

Digital filter 200 is designed so that it has a frequency response that is generally the inverse of the frequency response of the cable at the specific range being tested. That is, as the frequency response of the cable drops off due to high frequency loss and attenuation etc., the high frequency response of digital filter 200 increases. New filter parameters are used at each range increment. Each new filter has greater high frequency response than the one before it to compensate for the increased high frequency loss of the cable. Generally, digital filter 200 and, possibly, multiplier 40 and integrator 48 are written into software in a microprocessor or the like. Cable attenuation and frequency response can easily be obtained, either from the manufacturer or through some relatively simple tests. In this way, new filter parameters are automatically written into digital filter 200 each time the processing for a specific range is completed and processing for the next range is automatically started. In operation, for each range chip (or group of range chips) processed, the A/D samples, stored in memory 38, are first passed through digital filter 200. Because the frequency response of digital filter 200 is the inverse of the frequency response of the cable, the filtered A/D samples of returns at the current range have the same spectrum as returns at close ranges (which do not require filtering). This technique allows substantially the original high resolution out to a point at which the cable loss is so great that the high frequency return signals no longer make it back to digital filter 200 to be amplified.

Figure 18:
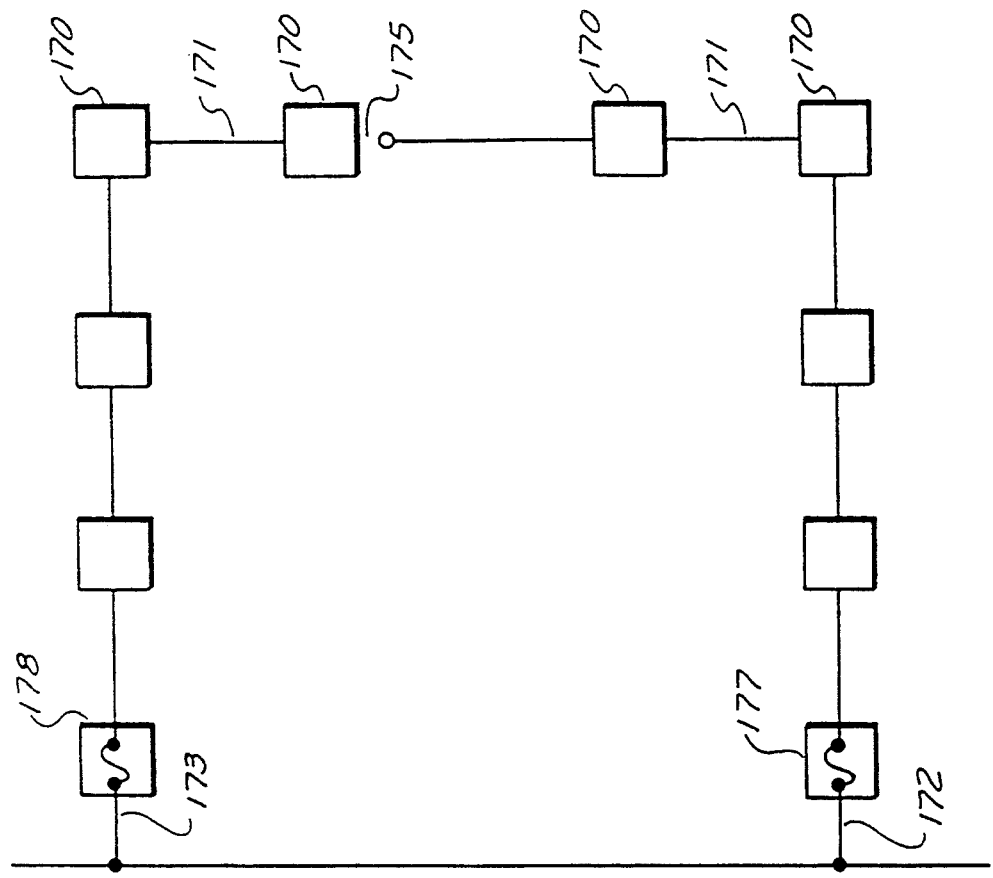
FIG. 18 is a block diagram representing an underground residential power distribution circuit.

Underground residential distribution (URD) circuits, generally as illustrated in FIG. 18, typically consist of 10 to 20 padmount transformers 170 connected together with underground distribution cable 171. Padmount transformers 170 step down the high voltage distribution current to low voltage household current. A URD circuit is typically fed from both ends 172 and 173 and left open in the middle at 175, as illustrated in FIG. 18. When a fault occurs, a fuse 177 or 178, on the faulted circuit blows and the neighborhood loses power. To restore power quickly, a troubleman comes out and locates the section of faulted cable. This cable is isolated from the circuit, the open in the center of the circuit is reconnected, and the blown fuse is replaced. The result is that the URD circuit is again fed from both ends except that now the open is at the section of faulted cable. Power to the neighborhood has been restored and the faulted section can be repaired at the power company's convenience.

From the above description it is clear that the goal of sectionalizing is to restore power to the neighborhood as quickly as possible. To do this, the faulted section of cable must be located. This locating is complicated by the fact that padmount transformers may be located in backyards and surrounded by fences. It is very time consuming if the troubleman must go to and open each padmount transformer to locate the section of faulted cable. In the current art, one technique used by the troubleman to "sectionalize" is to go to the first cable section and isolate each end from the padmount transformer. A portable high voltage charging unit is then used to energize the isolated cable section under test. If the cable charges up satisfactorily it indicates that the cable section is not faulted. The cable section is then reconnected to the padmount transformers and the next cable section is isolated and tested. The sectionalizing procedure is repeated until the faulted cable section is found.

An improved sectionalizing apparatus and method is provided, in which the apparatus is generally similar to, but may be simpler than, system 10. In the improved method, the troubleman arrives at the neighborhood and goes to either one of the fuses 177 or 178 or to first padmount transformer 170. He attaches system 10, incorporating computer compensation 160, to the cable. System 10, with the computer compensation apparatus 160, allows the larger cable impedance discontinuities resulting from padmount transformers 170, to be easily recognized and discriminated from other discontinuities such as construction splices. If the cable fault is either an open or a short, the fault shows up on display 50 as either an upward or downward directed pulse, respectively. The position of the pulse with respect to padmount transformers 170 is noted. By referring to a padmount transformer location map for the neighborhood, the troubleman can go directly to the location of the faulted cable section and isolate the cable section. The normally open cable section is then reattached, the fuse replaced, and the power restored to the neighborhood. If the cable fault is neither an open nor a short, the arc reflection method (previously described) is used to determine the fault location.

System 10, including computer compensation apparatus 160 (and digital filter 200, if necessary), is able to discriminate between reflections from padmount transformers 170 and other discontinuities, because the resolution of pulse compression system 10 is constant with range, for short or reasonable ranges, and the computer compensation apparatus 160 and technique removes multiple reflections and displays discontinuities at their true amplitude independently of range. Further, for longer ranges, system 10 can be switched into the high resolution compensation mode utilizing digital filter 200, if desired. A sectionalizer system, similar to system 10, can be provided which is simpler and more compact. Since a fault only has to be located with respect to padmount transformers 170, the locating resolution does not have to be as good as the resolution of system 10. Also, since the pulsed electrical signal does not have to be received above ground along the cable path, a low stability oscillator can be used in place of high stability oscillator 12, oscillator 45 can be eliminated, and high processing gain of system 10 and antenna unit 62 is not required. PN code generator 46 can be clocked with a signal from the low stability oscillator. The result is that the sectionalizer system is smaller, lower cost, and easier to use than system 10. In fact, sectionalizer system 10 may be sufficiently compact and economical so that each troubleman is supplied with a unit.

While I have shown and described specific embodiments of the invention, further modifications and improvements will occur to those skilled in the art. I desire it to be understood, therefore, that this invention is not limited to the particular forms shown and I intend in the append claims to cover all modifications that do not depart from the spirit and scope of this invention.

Having fully described the invention in such clear and concise terms as to enable those skilled in the art to understand and practice the same, the invention claimed is:

1. A method of finding a fault in an electrical cable comprising the steps of:
   introducing a pulsed electrical signal into a near end of an electrical cable, the pulsed electrical signal producing second and third pulses of electrical energy representative of the reflected electrical energy from a fault in the cable and reflected electrical energy from a far end of the cable;
   sensing, adjacent the near end of the cable, the pulsed electrical signal and the second and third pulses and providing an indication of a time between the second and third pulses;
   sensing the time between the pulsed electrical signal and the third pulse at a plurality of different positions along the electrical cable until a position is reached at which the time between the pulsed electrical signal and the third pulse is approximately equal to the indication of the time between the second and third pulses; and
   noting the position of the fault at the position along the electrical cable where the times are equal.

2. A method of finding a fault in an electrical cable as claimed in claim 1 wherein the fault is a high resistance fault, the method further includes the step of introducing a relatively high voltage discharge into the near end of the electrical cable prior to the step of introducing a pulsed electrical signal into the near end of the electrical cable.

3. A method of finding a fault in an electrical cable as claimed in claim 2 wherein the step of introducing a pulsed electrical signal into the near end of the electrical cable is performed as the relatively high voltage discharge introduced into the near end of the electrical cable reduces the high resistance fault to a relatively low resistance fault.

4. A method of finding a fault in an electrical cable as claimed in claim 1 wherein the step of sensing the time between the pulsed electrical signal and the third pulse includes the steps of measuring the time between the pulsed electrical signal and the third pulse for at least one distance in a first direction from the fault and measuring the time between the pulsed electrical signal and the third pulse for at least one distance in an opposite direction from the fault and averaging the measured times to obtain an average time between the pulsed electrical signal and the third pulse which is approximately equal to the indication of the time between the second and third pulses.

5. A method of finding a fault in an electrical cable comprising the steps of:
introducing a pulsed electrical signal into a near end of an electrical cable including the step of utilizing pulse compression to produce the pulsed electrical signal, the pulsed electrical signal producing second and third pulses of electrical energy representative of the reflected electrical energy from a fault in the cable and reflected electrical energy from a far end of the cable;
sensing, adjacent the near end of the cable, the pulsed electrical signal and the second and third pulses and providing an indication of a time between the second and third pulses;
sensing the time between the pulsed electrical signal and the third pulse at a plurality of different positions along the electrical cable until a position is reached at which the time between the pulsed electrical signal and the third pulse is approximately equal to the indication of the time between the second and third pulses;
noting the position of the fault at the position along the electrical cable where the times are equal.

6. A method of finding a fault in an electrical cable as claimed in claim 5 wherein the step of utilizing pulse compression includes the step of continuously clocking a pseudo-random noise code generator to produce the pulsed electrical signal.

7. A method of finding a fault in an electrical cable as claimed in claim 6 wherein the step of continuously clocking the pseudo-random code generator includes utilizing a pseudo-random noise code generator which operates in a range of 1K to 1M chips.

8. A method of finding a fault in an electrical cable as claimed in claim 6 wherein the step of continuously clocking the pseudo-random noise code generator includes utilizing an oscillator to produce clocking signals.

9. A method of finding a fault in an electrical cable as claimed in claim 8 wherein the step of utilizing an oscillator to produce the clocking signals includes utilizing an oscillator with an output in the frequency range of 1 MHz to 1 GHz.

10. A method of finding a fault in an electrical cable comprising the steps of;
introducing a pulsed electrical signal into a near end of an electrical cable, the pulsed electrical signal producing second and third pulses of electrical energy representative of the reflected electrical energy from a fault in the cable and reflected electrical energy from a far end of the cable;
sensing, adjacent the near end of the cable, the pulsed electrical signal and the second and third pulses and providing an indication of a time between the second and third pulses, including the steps of digitizing the sensed pulses and storing the digitized pulses as an indication of the time between the second and third pulses;
sensing the time between the pulsed electrical signal and the third pulse at a plurality of different positions along the electrical cable until a position is reached at which the time between the pulsed electrical signal and the third pulse is approximately equal to the indication of the time between the second and third pulses;
noting the position of the fault at the position along the electrical cable where the times are equal.

11. A method of finding a fault in an electrical cable comprising the steps of:
introducing a pulsed electrical signal into a near end of an electrical cable, the pulsed electrical signal producing second and third pulses of electrical energy representative of the reflected electrical energy from a fault in the cable and reflected electrical energy from a far end of the cable;
sensing, adjacent the near end of the cable, the pulsed electrical signal and the second and third pulses and providing an indication of a time between the second and third pulses, including digitally filtering the sensed pulses to compensate for high frequency attenuation in the electrical cable;
sensing the time between the pulsed electrical signal and the third pulse at a plurality of different positions along the electrical cable until a position is reached at which the time between the pulsed electrical signal and the third pulse is approximately equal to the indication of the time between the second and third pulses;
noting the position of the fault at the position along the electrical cable where the times are equal.

* * * * *